United States Patent [19]

Petcavich

[11] 4,424,900
[45] Jan. 10, 1984

[54] ANTI-STATIC PACKAGES AND PACKAGING MATERIAL

[76] Inventor: Robert J. Petcavich, 2954 Mission Blvd. #4, San Diego, Calif. 92101

[21] Appl. No.: 439,857

[22] Filed: Nov. 8, 1982

[51] Int. Cl.³ .................. B65D 73/02; B65D 85/42
[52] U.S. Cl. ................................. 206/328; 428/922
[58] Field of Search .............. 206/328, 524.6, 332, 206/334; 428/922, 215; 150/1

[56] References Cited

U.S. PATENT DOCUMENTS

| | | | |
|---|---|---|---|
| 3,223,554 | 12/1965 | Newman | 428/922 |
| 3,801,418 | 4/1974 | Cornelis et al. | 428/922 |
| 4,154,344 | 5/1979 | Yenni, Jr. et al. | 206/328 |
| 4,160,503 | 7/1979 | Ohlbach | 206/328 |
| 4,211,324 | 7/1980 | Ohlbach | 206/328 |
| 4,238,030 | 12/1980 | Maylandt | 206/328 |
| 4,241,829 | 12/1980 | Hardy | 206/328 |
| 4,336,093 | 6/1982 | Kohayakawa et al. | 428/922 |

FOREIGN PATENT DOCUMENTS 2821182  11/1979  Fed. Rep. of Germany ...... 206/328

*Primary Examiner*—Joseph Man-Fu Moy
*Attorney, Agent, or Firm*—McAulay, Fields, Fisher, Golstein & Nissen

[57] ABSTRACT

An anti-static package composed of a multiply flexible film. The inner ply is an anti-static material and the outer ply is an electrically insulating material. A conductive metallic ply is sandwiched between the inner and outer ply. The conductive material is sputtered onto one of the two plies and the other ply is bonded by an adhesive bond to the metal ply.

20 Claims, 2 Drawing Figures

ANTI-STATIC PACKAGES AND PACKAGING MATERIAL

BACKGROUND OF THE INVENTION

This invention relates in general to packaging material and to the packages formed from such material for use in packaging electronic and medical products where it is important that static charge buildup on the interior of the package be avoided.

The problem with packaging electronic components and units so as to avoid the affects of electrostatic discharge has become increasingly acute as smaller and smaller dimensions are achieved in integrated circuits. The buildup of electrostatic charges on the packages for these components and units can result in the discharge of a spark which will destroy the micro-electronic chip, printed circuit or other electronic unit. For example, a static charge of as little as 100 volts can discharge through a 1000 Angstrom thick gate oxide to cause a short and to render a MOS device nonfunctional.

Similarly ultra pure chemicals and drugs used in both electronic and medical industries have severe restrictions on the amount of foreign particulate matter which can be present. Packaging these chemicals poses severe problems because an electrostatic charged surface will attract charged particulate matter in the air and cause contamination.

Accordingly in a wide range of industry, from aero space and electronic to medical and drug, the prevention and control of static charge buildup on the packages in which goods are packed and shipped is a major goal.

There are known anti-static packages and packaging material to prevent and minimize static buildup. In one approach, a plastic film or sheet is compounded with an anti-static additive such as a quaternery amine, amine salts or soaps which gives a product that will not build up a static charge. Packages and bags formed of such material have been used. A major drawback for such packages is that this design provides no shielding from external static fields.

One technique for grounding electrostatic charges brought into contact with the envelope or packages is described in U.S. Pat. No. 4,154,344 and No. 4,156,751 both issued to Yenni et. al. These patents teach a design in which a flexible substrate of a polyester film is coated on one side with an anti-static polyethylene material and on the other side with a very thin layer of nickel. The anti-static ply defines the interior of the package. The metal ply is on the exterior of the package. Because it is a metal layer, electrostatic charge will not build up. The nickel is vacuum deposited and is thin enough to be partially transparent. However, the optical transmission of the nickel layer in the visual spectrum is sufficiently poor to hinder visual inspection of stored items. Furthermore, when the package is flexed, particulate matter tends to flake off from the very thin nickel layer and may contaminate clean room environments. A very thin abrasion resistant layer on the outside of the nickel ply is not adequate to prevent this particulate matter flake-off. Furthermore, in certain environments where electronic components are taken out of the package for testing and are replaced, the external or substantially external metal ply provides a conductive path and contact with an electric terminal may provide a source of electrical shock to the testing personnel.

Accordingly, it is a purpose of this invention to provide an improved anti-static sheet material which in addition to providing the anti-static benefits of known prior art devices will provide improved ability to visually inspect the products packaged, an enhanced safety feature against conductive shock and reduced risk of contaminating clean room environments.

It is important to achieve these objectives while retaining the flexible nature of the sheet material employed for the package or bag and while retaining the fully effective anti-static qualities of the bag both as to electrostatic buildup within the package and electrostatic field.

BRIEF DESCRIPTION

In brief in one embodiment of this invention, the above objectives are obtained by a package formed from a flexible sheet material. The flexible sheet material has a substrate ply of an electrically insulating polyester having a thickness of, for example, one mil (0.025 mm). A stainless steel ply is sputter coated onto one surface of the substrate. This conductive metal ply has a thickness in the range of, for example, 1000 Angstroms and has an optical transmission greater than 70% in the visual region. On the other surface of the metal ply there is adhered an anti-static polyolefin material having a thickness of, for example, one mil.

The anti-static ply forms the inner surface of the package and the polyester substrate ply forms the outer surface of the package.

The thickness of the substrate which forms the outer surface of the package is sufficiently great so that contact with a terminal on a work bench will prevent discharge through the metal ply and thus avoid the risk of shock to testing personnel through physical contact with the package. However, the thickness of the substrate ply is little enough so that any significant static voltage charge will discharge through the outer ply to the metal ply and thus be dissipated. In this fashion an optimum trade-off is obtained between an anti-static function and an insulating function. In addition the substrate acts as a protective ply to prevent any chance of metal disintegration and contamination of the environment.

BRIEF DESCRIPTION OF THE FIGURES

FIG. 2 is at a substantially enlarged scale, as contrasted with FIG. 1, in order to illustrate the plies of the flexible sheet material of this invention.

DESCRIPTION OF THE PREFERRED EMBODIMENTS

Figure 1:
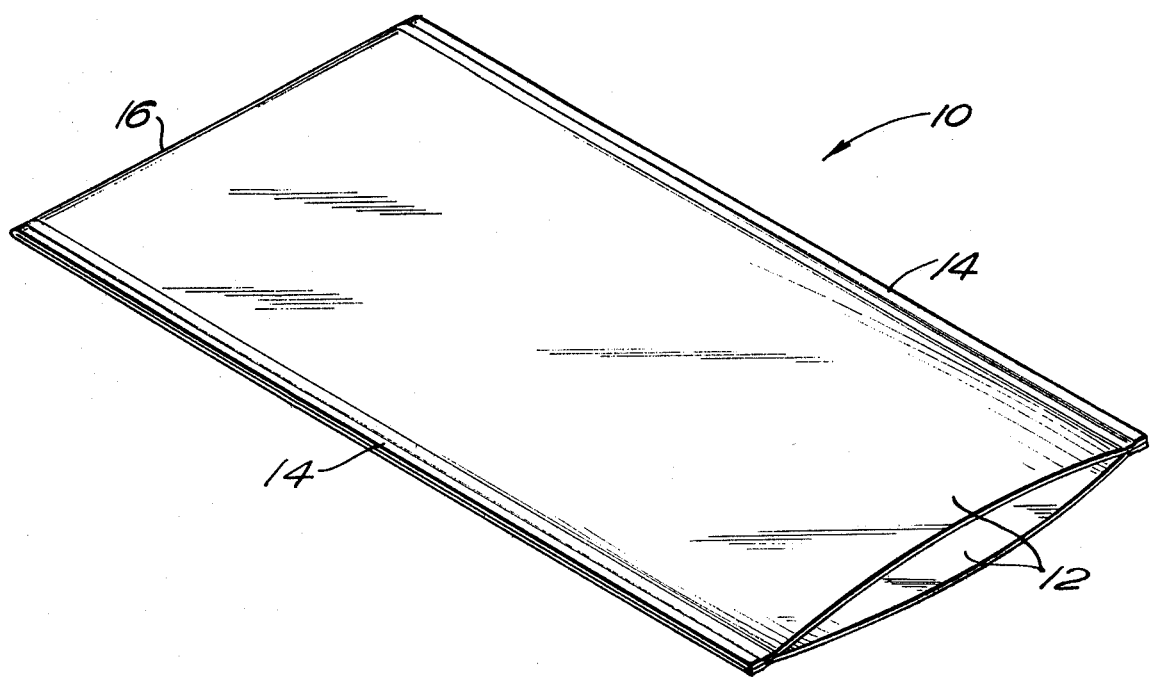
FIG. 1 is a perspective view of a package formed in accordance with the teachings of this invention.

The package 10 of this invention may have any one of a number of configurations including the envelope configuration shown in FIG. 1. As shown in FIG. 1, the envelope 10 is defined by first and second walls 12 which are heat sealed along edges 14 in order to define the package 10. As is known, it is convenient to form the envelope type of package by folding over the flexible sheet material involved so that the fold defines the bottom edge 16 of the envelope.

Figure 2:
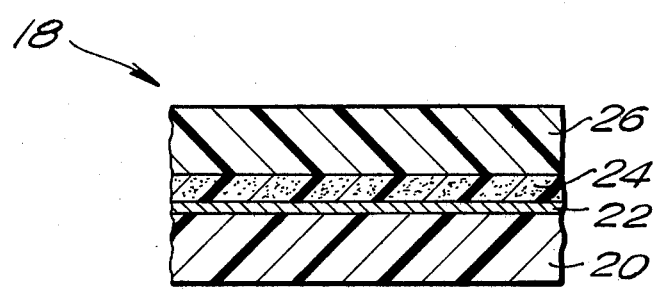
FIG. 2 is a cross-sectional view through the sheet material used to form the package of FIG. 1.

The flexible sheet material 18 of which the envelope 10 is formed is, as shown in FIG. 2, composed of a number of plies. These plies are the substrate ply 20, the conductive metal ply 22, an adhesive ply 24 and an anti-static ply 26. The substrate ply 20 defines the outer surface of the package 10 and the anti-static ply 26 defines the inner surface of the package 10.

In one embodiment, the sheet material 18 is approximately 2 mils (0.05 mm) thick. The substrate 20 is approximately one mil thick and is a polymeric material such as polyester. It may range anywhere between 0.5 and 2.0 mils in thickness. The anti-static ply 26 is approximately one mil thick and is an anti-static polyolefin material. It may range anywhere from 0.5 to 2.0 mils in thickness. The metal ply 22 is a sputtered stainless steel ply of anywhere between 100 and 1500 Angstroms thick. It may consist of a number of materials other than stainless steel. Stainless steel is preferred because of its relative transparency, as contrasted with nickel, in the visual range of light. The adhesive ply 24 is an acrylic material somewhere between 0.1 and 1.0 mils thick. The surface resistivity of the anti-static ply is preferably between $10^6$ to $10^{12}$ ohms per square, the volume resistivity of the polyester substrate is preferably at least $10^{10}$ ohm-cm and the surface resistivity of the metal ply is no greater than approximately $5 \times 10^4$ ohms per square.

In fabrication, the metal ply 22 is sputtered onto the substrate 20 and then the adhesive ply 24 and anti-static ply 26 are added. Because of the sputtering of the metal ply onto the substrate 20, the very thin metallic layer is not adversely affected by the adhesive material and particularly is unaffected by the solvent employed in the adhesive material. Accordingly a firm bond can be achieved between all the plies while retaining the electrical continuity and thus conductivity of the metal ply 22.

Althrough a stainless steel material is a presently preferred material to be sputtered onto the substrate 20, there are certain other metals which may be employed to obtain a comparable transparency or light transmission. Among these other metals are titanium, tantalum, an indium tin alloy and an indium tin oxide. One advantage of the use of such metals, as contrasted to nickel, is a substantial light transmission of the resulting film material. A light transmission in excess of 70% can be achieved.

Because of the combination of the materials as set forth above, there is provided a flexible material anti-static package which is resistant to the buildup of static charge on the interior of the package as well as to discharge of a static charge developed outside of the package. Yet this package performs this anti-static function with improved visibility permitting an inspection of the product without removal of the product and with enhanced safety from personnel shock due to conduction through the packaging material upon contact with an electrode.

What I claim is:

1. A package adapted to receive and protect an electronic component, the walls of the package formed of a flexible sheet material comprising:
    a first ply of an electrically insulating material,
    a second ply of a conductive material, and
    a third ply of an anti-static material,
    said second ply being embedded on the surface of one of said first or third plies and the other one of said first or third plies being bonded to said conductive second ply,
    said conductive second ply composed of a material providing a surface resistivity no greater than approximately $5 \times 10^4$ ohms per square and being sufficiently transparent to permit visual identification of a component through the envelope,
    said conductive second ply being sandwiched between said first and third plies.

2. The package of claim 1 wherein said first ply has a volume resistivity of at least $10^{10}$ ohm-centimeters.

3. The package of claim 1 wherein said anti-static third ply defines the inner surface of the envelope.

4. The package of claim 1 wherein said anti-static third ply has a surface resistivity in the range of $10^6$ to $10^{12}$ ohms per square.

5. The package of claim 3 wherein said anti-static third ply has a surface resistivity in the range of $10^6$ to $10^{12}$ ohms per square.

6. The package of claim 1 wherein each of said plies is sufficiently transparent to provide a view of any item contained in the envelope.

7. The package of claim 1 wherein said conductive second ply is a metallic material that is sputter coated onto said one of said first or third plies.

8. The package of claim 6 wherein said conductive second ply is a metallic material that is sputter coated onto said first ply.

9. The package of claim 1 wherein said first ply is a polymeric sheet having a thickness of between 0.5 and 2.0 mils, said anti-static third ply has a thickness of between 0.5 and 2.0 mils and said conductive second ply has a thickness of between 100 and 1,500 Angstroms.

10. The package of claim 8 wherein said first ply is a polymeric sheet having a thickness of between 0.5 and 2.0 mils, said anti-static third ply has a thickness of between 0.5 and 2.0 mills and said conductive second ply has a thickness of between 100 and 1,500 Angstroms.

11. The package of claim 1 further comprising: a fourth adhesive ply between said conductive second ply and said other one of said first or third plies.

12. The package of claim 10 further comprising: a fourth adhesive ply between said conductive second ply and said other one of said first or third plies.

13. The package of claim 7 wherein said conductive ply is a stainless steel having a visible light transmission of at least 70%.

14. A multi-ply flexible packaging material adapted to be used for packaging electronic components comprising:
    a first ply of an electrically insulating material,
    a second ply of a conductive material, and
    a third ply of an anti-static material,
    said second ply being embedded on the surface of one of said first or third plies and the other one of said first or third plies being bonded to said conductive second ply,
    said conductive ply composed of a material providing a surface resistivity no greater than approximately $5 \times 10^4$ ohms per square and being sufficiently transparent to permit visual identification of a component through the multi-ply material.

15. The packaging material of claim 14 wherein said first ply has a volume resistivity of at least $10^{10}$ ohm-centimeters.

16. The packaging material of claim 14 wherein said anti-static third ply has a surface resistivity in the range of $10^6$ to $10^{12}$ ohms per square.

17. The packaging material of claim 14 wherein each of said plies is sufficiently transparent to provide a view of any item contained in the packaging material.

18. The packaging material of claim 14 wherein said conductive second ply is a metallic material that is sputtered onto said one of said first or third plies.

19. The packaging material of claim 14 wherein said first ply is a polymeric sheet having a thickness of between 0.5 and 2.0 mils, said third anti-static ply has a thickness of between 0.5 and 2.0 mils and said conductive second ply has a thickness of between 100 and 1,500 Angstroms.

20. The packaging material of claim 14 further comprising: a fourth adhesive ply between said conductive second ply and said other one of said first or third plies.

* * * * *